(12) United States Patent
Mao

(10) Patent No.: US 8,518,825 B1
(45) Date of Patent: Aug. 27, 2013

(54) METHOD TO MANUFACTURE TRENCH-FIRST COPPER INTERCONNECTION

(71) Applicant: Zhibiao Mao, Shanghai (CN)

(72) Inventor: Zhibiao Mao, Shanghai (CN)

(73) Assignee: Shanghai Huali Microelectronics Corporation, Shanghai (CN)

( * ) Notice: Subject to any disclaimer, the term of this patent is extended or adjusted under 35 U.S.C. 154(b) by 0 days.

(21) Appl. No.: 13/726,532

(22) Filed: Dec. 24, 2012

(51) Int. Cl.
| | |
|---|---|
| *H01L 21/44* | (2006.01) |
| *H01L 21/00* | (2006.01) |
| *H01L 21/4763* | (2006.01) |
| *H01L 21/31* | (2006.01) |
| *H01L 21/469* | (2006.01) |
| *H01L 23/48* | (2006.01) |
| *H01L 23/52* | (2006.01) |

(52) U.S. Cl.
USPC ............. 438/675; 438/85; 438/633; 438/637; 438/687; 438/762; 257/774

(58) Field of Classification Search
USPC ................... 438/85, 633, 637, 675, 687, 762; 257/774
See application file for complete search history.

(56) References Cited

U.S. PATENT DOCUMENTS

| | | | | |
|---|---|---|---|---|
| 2005/0106764 | A1* | 5/2005 | Kim ................... | 438/14 |
| 2005/0142874 | A1* | 6/2005 | Keum ............... | 438/687 |
| 2006/0105565 | A1* | 5/2006 | Liu et al. ............ | 438/633 |
| 2006/0270228 | A1* | 11/2006 | Lee et al. ............ | 438/687 |
| 2007/0018332 | A1* | 1/2007 | Ueno ................ | 257/774 |
| 2007/0293039 | A1* | 12/2007 | Bu et al. ............. | 438/627 |
| 2008/0274614 | A1* | 11/2008 | Kim ................... | 438/675 |
| 2008/0293245 | A1* | 11/2008 | Abe ................... | 438/675 |

FOREIGN PATENT DOCUMENTS

| | | |
|---|---|---|
| CN | 101546727 A | 9/2009 |
| CN | 102002666 A | 4/2011 |

* cited by examiner

*Primary Examiner* — Ha Tran T. Nguyen
*Assistant Examiner* — Thai T Vuong
(74) *Attorney, Agent, or Firm* — Michael D. Eisenberg; Jeanette Meng Nakagawa

(57) ABSTRACT

The present invention relates to manufacturing technology of damascene copper interconnection in the semiconductor manufacturing field, and especially relates to a method to manufacture by trench-first copper interconnection. The method to manufacture trench-first copper interconnection forms metal trench and VIA hole structures in the photoresist which can form a hard mask through exposure and development processes, and then forms metal interconnection lines via etching metal trench and VIA hole in one etch process. The above method replaces the existing.

9 Claims, 11 Drawing Sheets

METHOD TO MANUFACTURE TRENCH-FIRST COPPER INTERCONNECTION

FIELD OF THE INVENTION

The present invention relates to manufacturing technology of damascene copper interconnection in the semiconductor manufacturing field, and especially relates to a method to manufacture by trench-first copper interconnection.

BACKGROUND OF THE INVENTION

The critical dimension (CD) of transistors is continuous scaled down as integration level of semiconductor chips increases. As the CD of transistors is scaled down below 130 nm, the mainstream process in metal inter connection field to gradually use copper interconnection instead of aluminum interconnection because of the high resistance characteristic of aluminum. The widely-used method to manufacture copper interconnections is using damascene process as inlaying technology, and the trench-first dual damascene process is one of methods to form copper wire interconnections and copper VIA-holes in one-step. FIG. 1a-1f diagrams structural flow of the trench-first dual damascene process. Depositing a low-k dielectric layer 12 on the silicon substrate layer 11 as is shown in FIG. 1a; Coating a first photoresist 13 on the low-k dielectric layer as is shown in FIG. 1b; Removing the first photoresist 13 to form a metal trench structure 14 in the low-k dielectric layer 12 using lithography and etch technology as is shown in FIG. 1c; Coating a second photoresist 15 on the upper surface of the low-k dielectric layer 12, and coating the second photoresist on the side-wall and the bottom of the metal trench structure 14 as is shown in FIG. 1d; Then removing the second dielectric 15 to form a VIA hole 16 through metal trench structure 14 and reaching on the upper surface of the substrate layer 11 using lithography and etch technology as is shown in FIG. 1e; Filling metal material in the metal trench structure 14 and the VIA hole 16 to form metal interconnection line disposed in the first metal trench 17 and VIA-hole metal 18 using metal deposition and CMP technology.

When the CD of transistors is scaled down below 32 nm, a single exposure process is not enough to meet the resolution requirement in manufacturing dense line array pattern, so dense line array pattern of which the CD is below 32 nm is formed wildly using double patterning technique. FIG. 2a-2e is flow diagrams of the double patterning technique. As is shown in FIG. 2a, sequentially depositing substrate film 22, hard mask 23 and first photoresist 24 on the silicon substrate 21; As is shown in FIG. 2b, removing the first photoresist 24 using exposure, development and etching technology, and forming a first line pattern 25 and a metal trench structure 26, which the CD ratio of the line pattern 25 and the metal trench structure 26 is 1:3; As is shown in 2c, coating a second photoresist 27 on the upper surface and the side face of the first line pattern 25, the side-wall and the bottom of the metal trench structure 26 and the upper surface of the substrate film 22; As is shown in FIG. 2d, forming a second line pattern 28 in the second photoresist 27 using exposure and development technology, meanwhile removing the rest second photoresist 27, and the CD ratio of the second line pattern 28 and the metal trench structure 26 is also 1:3, which the second line pattern 28 is in the middle of the metal trench structure 26; As is shown in FIG. 2e, removing the first line pattern 25 and the second line pattern 28 on the substrate film 22 using etching technology, and forming a target line 29 and a metal trench structure 210, the CD ratio of the target line 29 and the metal trench structure 210 is 1:1, which means the combination of the target line 29 and the metal trench structure 210 can form dense line array pattern. The double patterning technique needs two times of lithography and etch processes, which means the cost is much more than the traditional single exposure technology. Hence, it is desired to develop new techniques to reduce the cost of double patterning technique. The US patent US20100190104 disclosed a method that coating polymer curing material containing alkoxy group after developing the first photoresist pattern, to cure the first photoresist pattern in the first photoresist. The double patterning process with this method can be simplified to be litho-litho-etch, which omits the first etching step in the former process, so as to effectively reduce the cost of the double patterning technique. And this method is also known as double exposure technique.

SUMMARY OF THE INVENTION

The present invention discloses a method to manufacture trench-first copper interconnection to solve the above problems, which is mainly a process to manufacture dual damascene metal interconnection using double exposure technique and photoresists which act as a hard mask.

The aim of the present invention is achieved by the following technical solution:

A method to manufacture trench-first copper interconnection, wherein includes the following steps:

Step S1, depositing a dielectric layer on a silicon substrate;

Step S2, coating a first photoresist on said dielectric layer;

Step S3, after exposure and development through a lithography process, removing a part of said first photoresist until a portion of upper surface of said dielectric layer is exposed, and forming a first metal trench structure in the rest first photoresist;

Step S4, coating curing material to cover the upper surface of the rest first photoresist, the side-wall and the bottom of the first metal trench structure;

Step S5, heating said curing material, and forming a separation film on the surface of the rest first photoresist after removing the redundant curing material;

Step S6, coating a second photoresist to cover the upper surface of said separation film and to fulfill said first metal trench structure formed after the curing process;

Step S7, after exposure and development through a lithography process, removing a part of said second photoresist until a portion of upper surface of said dielectric layer is exposed in said first metal trench structure, and forming a first VIA hole structure in the rest second photoresist which is above the first metal trench structure;

Step S8, keeping said rest second photoresist as a mask, and etching said dielectric layer until a portion of upper surface of said silicon substrate, then removing said rest second photoresist to form a second VIA hole; after removing said separation film, etching the rest dielectric layer using said rest first photoresist as a mask to form a second metal trench, and removing said rest first photoresist;

Step S9, filling metal material to said second VIA hole and said second metal trench, to form metal interconnection line disposed in the second metal trench and VIA-hole interconnection structure disposed in the second VIA hole.

The above method, wherein said step S1, said dielectric layer is a low-k dielectric layer.

The above method, wherein said step S2, said first photoresist is a photoresist which can form a hard mask.

The above method, wherein said step S4, said curing material is polymer material containing alkoxy group.

The above method, wherein said step S5, the range of the heating temperature comes from 30° C. to 200° C.

The above method, wherein said step S5, said separation film does not dissolve in said second photoresist.

The above method, wherein said step S5, using a developer to remove the rest curing material.

The above method, wherein the ratio of the etching resistance of said first photoresist and said second photoresist is greater than or equal to 1.5:1.

The above method, wherein said step S9, using metal deposition and CMP technology to fill metal material into said second VIA hole and said second metal trench structure, to form metal interconnection line disposed in the second metal trench and VIA-hole interconnection structure disposed in the second VIA hole.

The beneficial effects of the present invention are: forming metal interconnection by forming metal trench and VIA hole structures in the photoresist which can form a mask, via exposure and development through a lithography process, and then etching the metal trench and the VIA hole structures in one etch process. The above steps replace the existing process which makes the metal trench etching and the VIA hole etching as two separate steps, and effectively reduces steps in dual damascene metal interconnection process, as well as improve capacity and reduce cost.

DETAILED DESCRIPTION OF THE PREFERRED EMBODIMENT

The following is a further description of the present invention combined with figs and embodiments.

Figure 1A:
FIG. 1a-1f are structure flow diagrams of existing trench-first dual damascene technology.
Figure 1B:
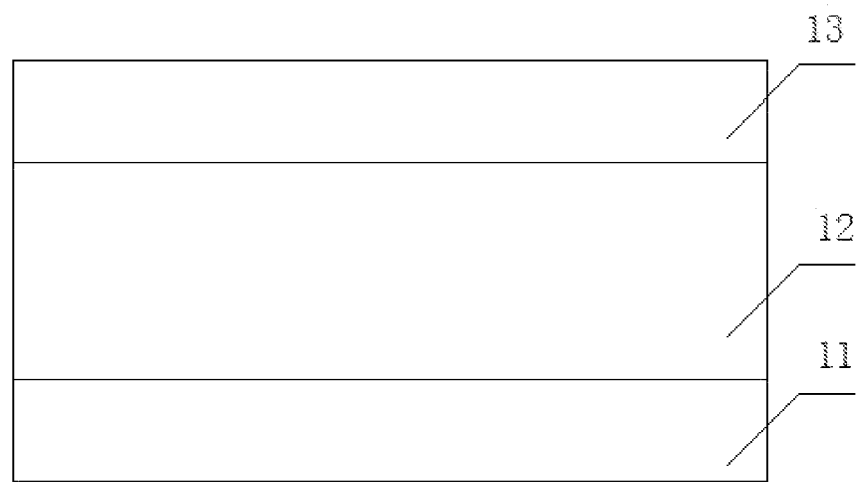
Figure 1C:
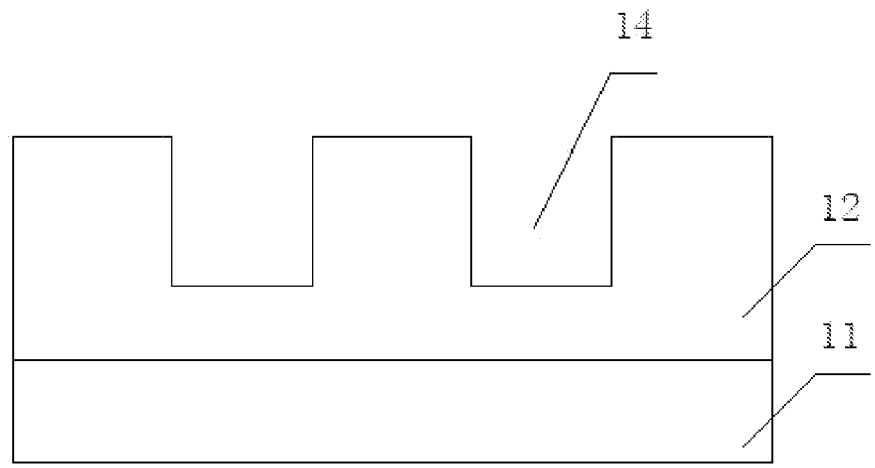
Figure 1D:
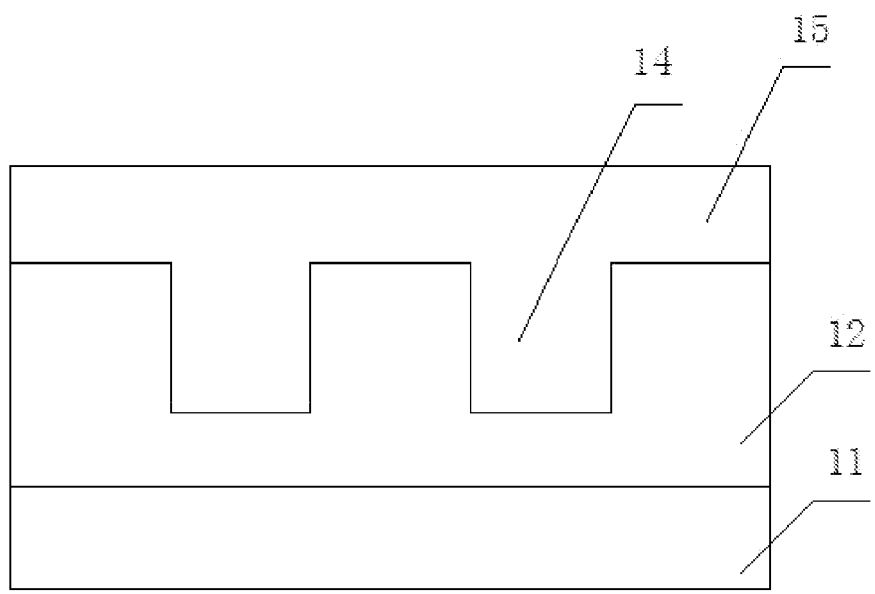
Figure 1E:
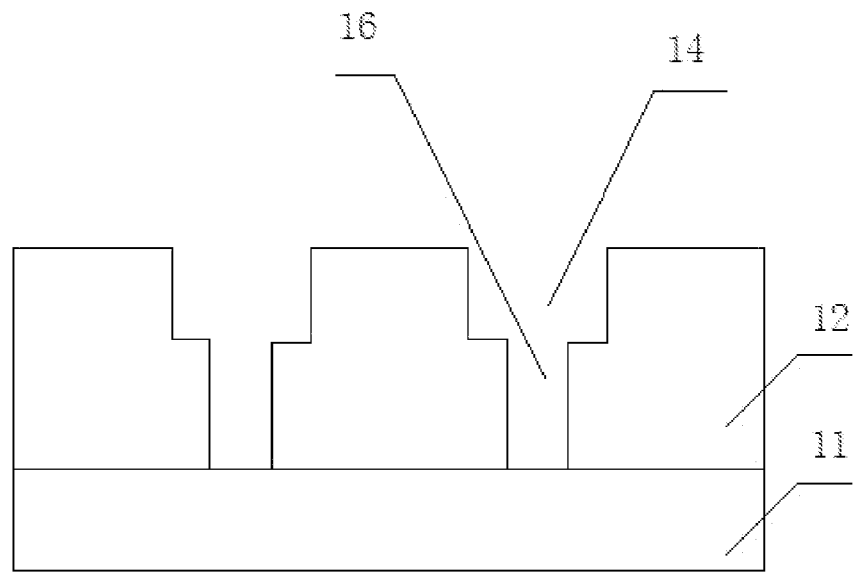
Figure 1F:
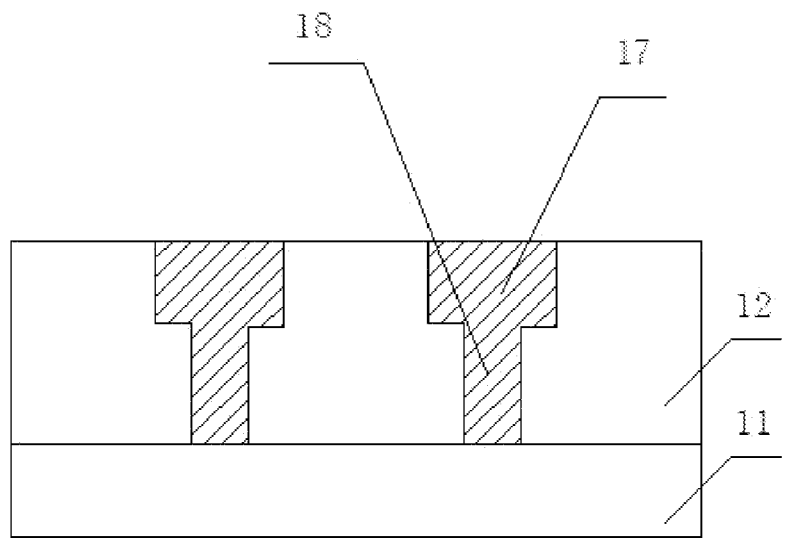
Figure 2A:
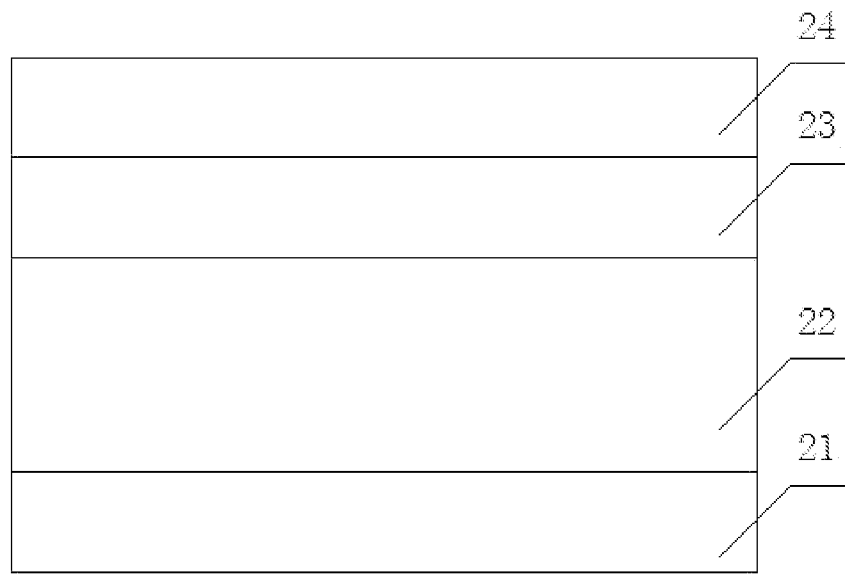
FIG. 2a-2e are structure flow diagrams of existing double patterning forming technique.
Figure 2B:
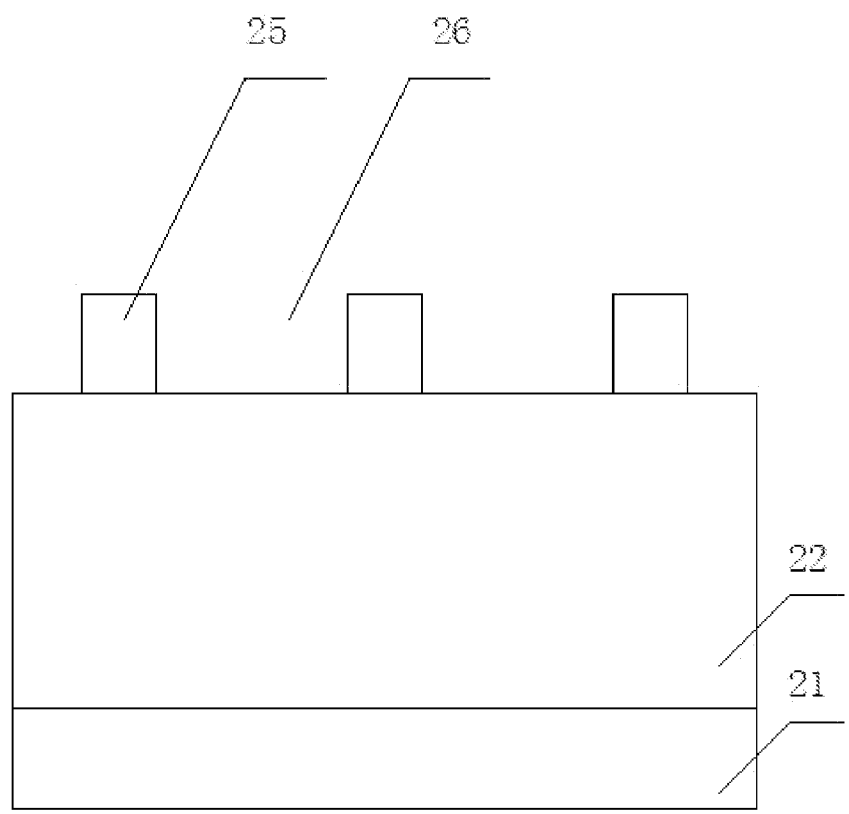
Figure 2C:
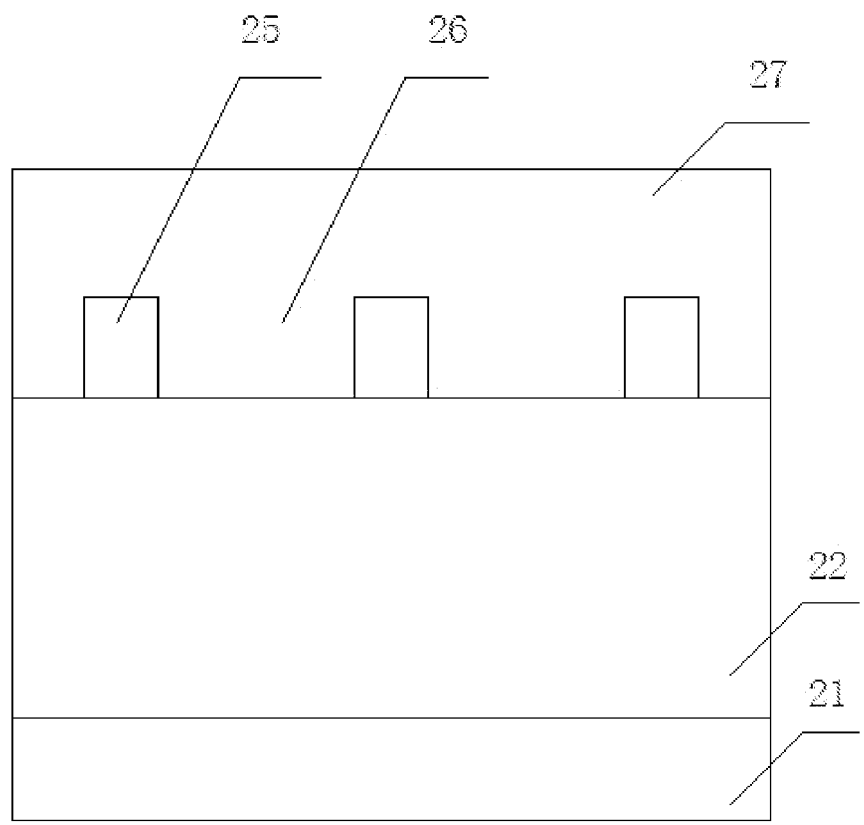
Figure 2D:
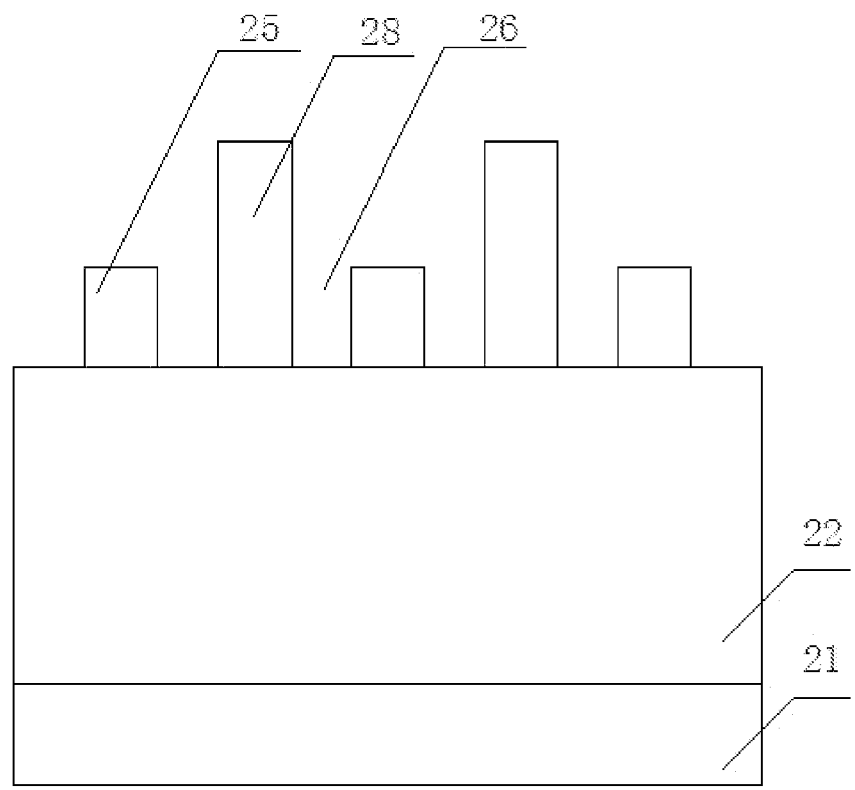
Figure 2E:
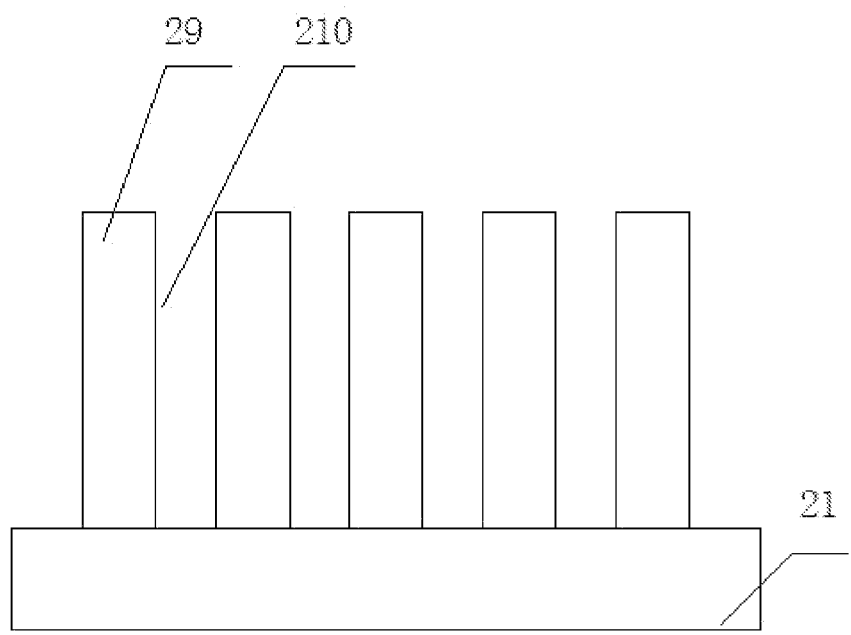
Figure 3A:
FIG. 3a-3i are structure flow diagrams of a method to manufacture trench-first copper interconnection in the present invention.

As is shown in FIG. 3a-3i, a method to manufacture trench-first copper interconnection includes the following steps:

As is shown in FIG. 3a, in the step S1: firstly, depositing a dielectric layer 32 on a silicon substrate 31;

In an embodiment of this invention, the dielectric layer 32 is a low-k dielectric layer.

Figure 3B:
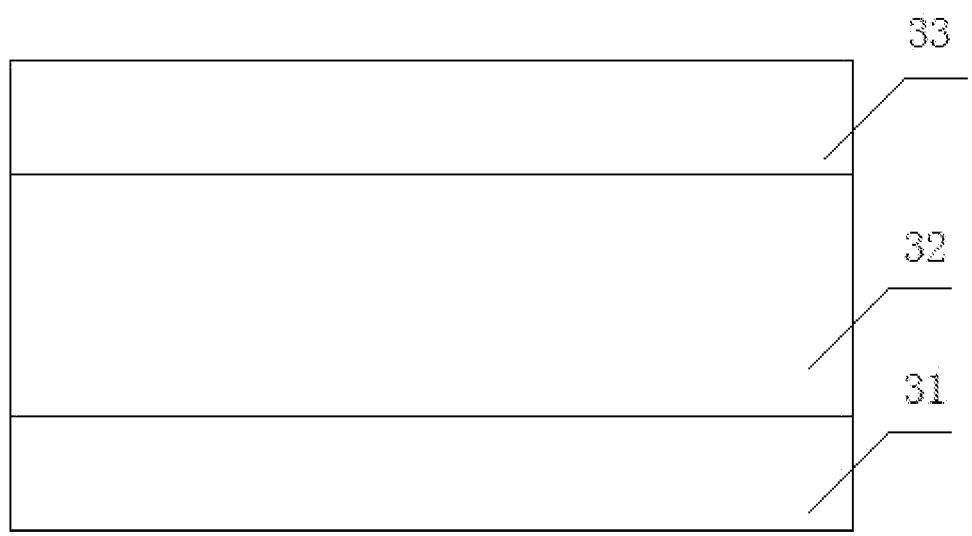

As is shown in FIG. 3b, in the step S2: coating a first photoresist 33 on the dielectric layer 32;

In this step, the first photoresist 33 is photoresist which can form hard mask, such as photoresist containing silyl group, siloxyl group, and silsesquioxane.

Figure 3C:
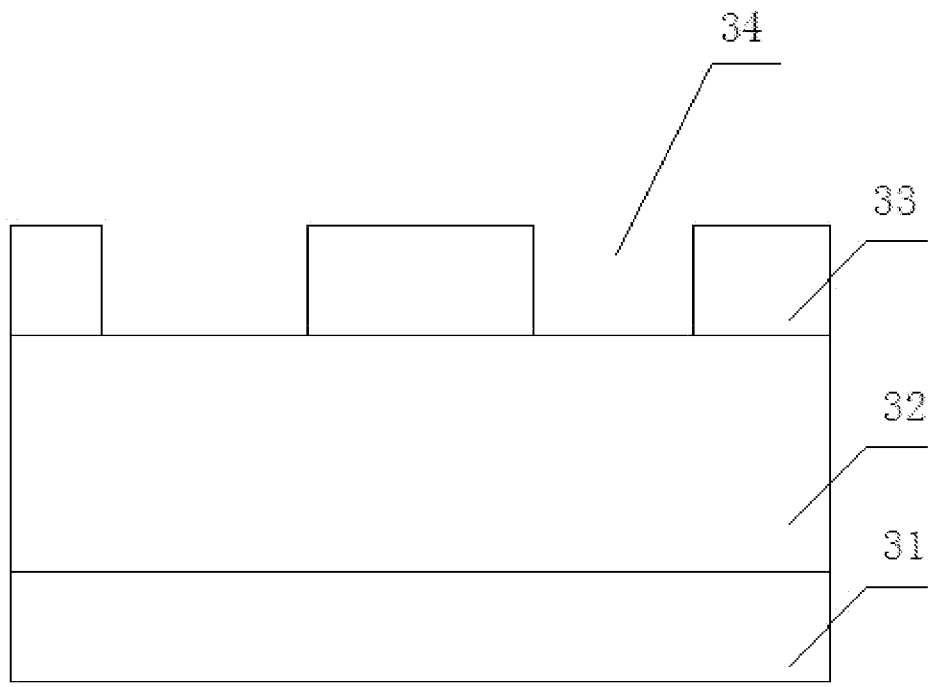
Figure 3D:
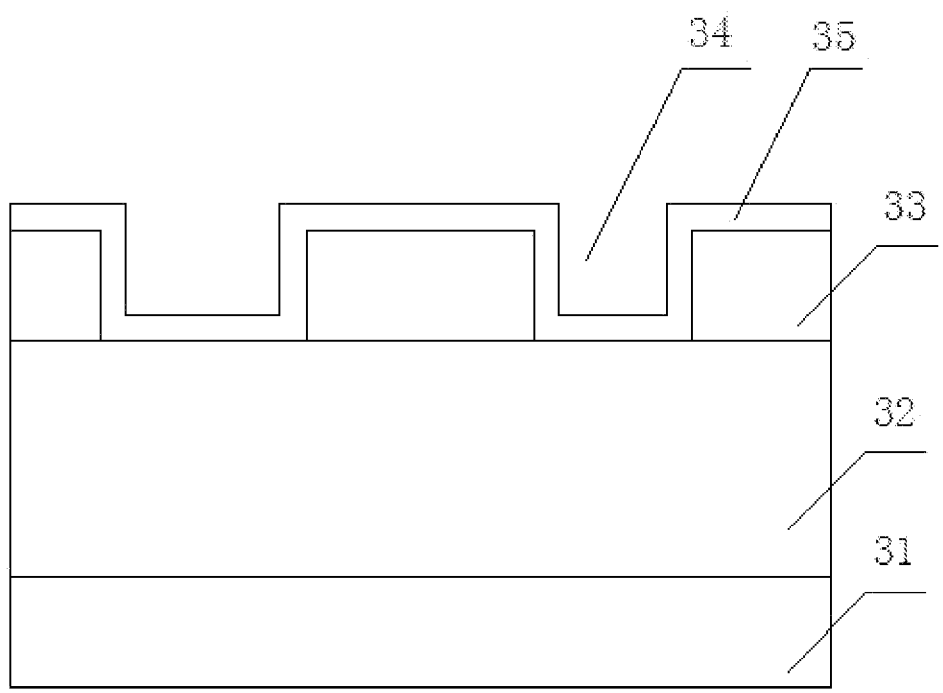

As is shown in FIG. 3c, in the step S3: after exposure and development through a lithography process, removing the first photoresist 33 until a portion of the upper surface of the dielectric layer 32 is exposed, and forming a first metal trench structure 34 in the rest first photoresist 33;

As is shown in FIG. 3d, in the step S4: coating curing material 35 to cover the upper surface of the first photoresist 33, the bottom and the side-wall of the first metal trench structure 34;

In this step, the curing material 35 is polymer material containing alkoxy group, such as acrylate or methacrylate polymer material containing alkoxy group.

Figure 3E:
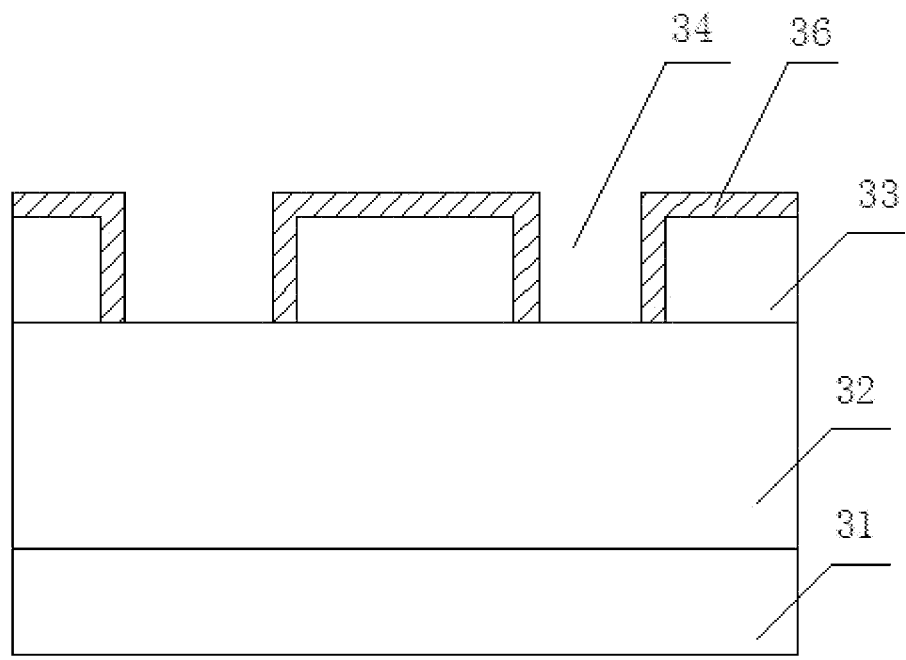
Figure 3F:
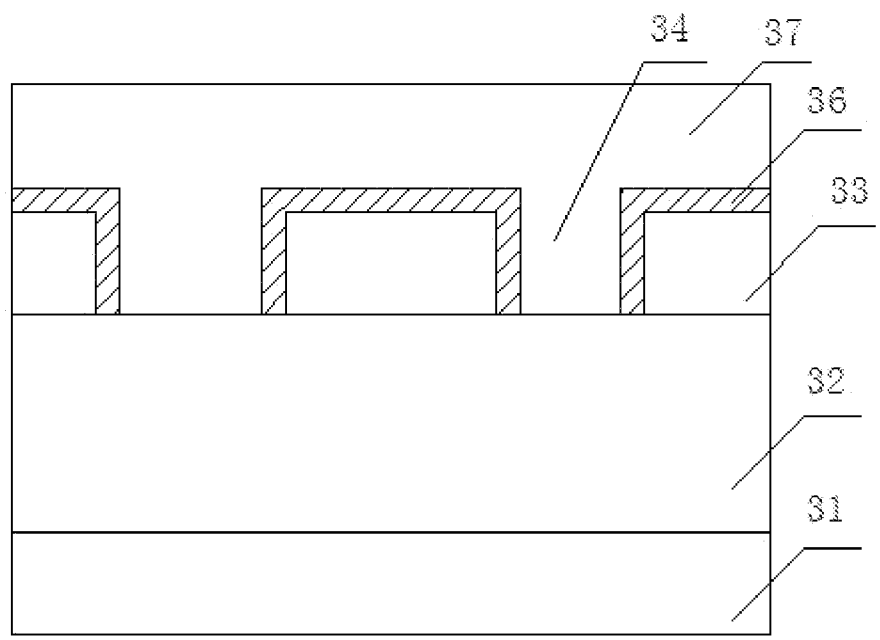

As is shown in FIG. 3e, in the step S5: heating the curing material 35, and forming a separation film 36 on the upper surface of the rest first photoresist 33 after removing the redundant curing material 35;

In one embodiment of this invention, the range of the heating temperature comes from 30° C. to 200° C., and can prefer to be 50° C. to 170° C.;

In this step, removing the rest curing material 35 by developer.

As is shown in 3f, in the step S6: coating a second photoresist 37 to cover the upper surface of the separation film 36 and to fulfill the first metal trench structure 34 after the curing process, and then;

In this step, the ratio of the etching resistance of the first photoresist 33 and the second photoresist 37 is greater than or equal to 1.5:1, and said separation film 36 does not dissolve in the second photoresist 37.

Figure 3G:
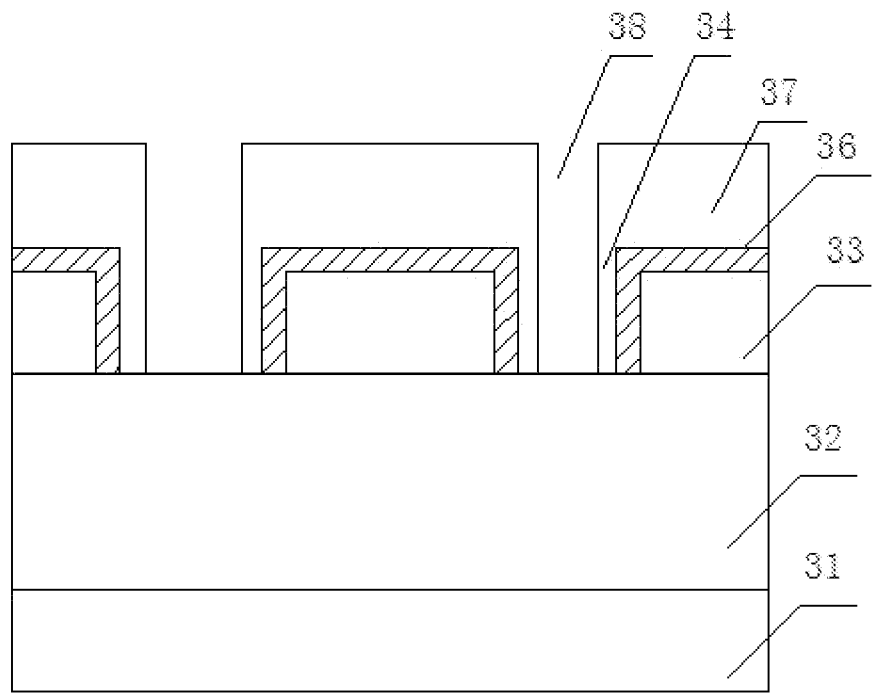
Figure 3H:
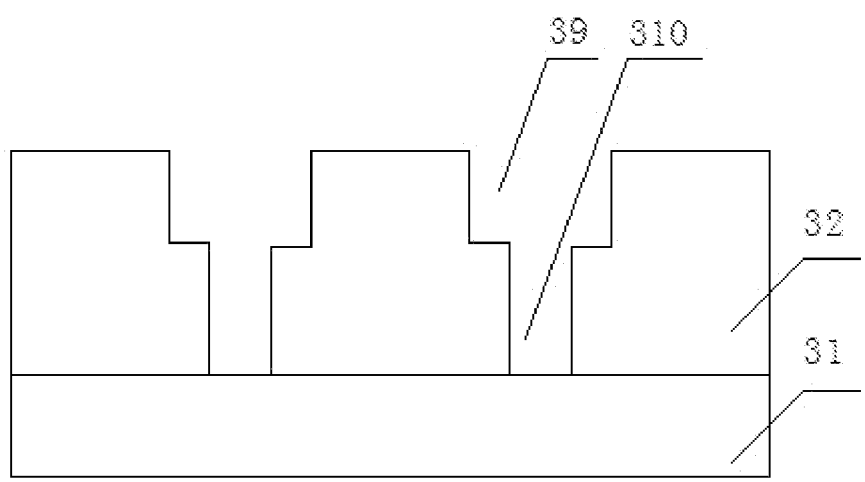
Figure 3I:
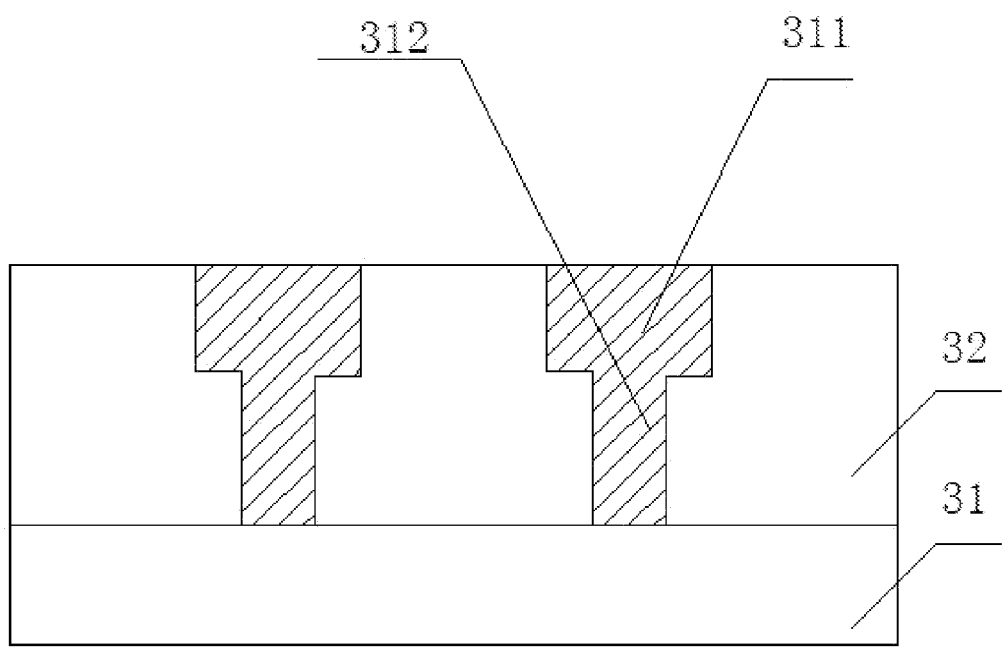

As is shown in FIG. 3g, in the step S7: after exposure and development through a lithography process, removing the second photoresist 37 until a portion of the upper surface of the dielectric layer is exposed in the first metal trench structure, and forming a first VIA-hole structure 38 in the rest second photoresist 37 which is above the first metal trench structure 34;

As is shown in FIG. 3h, in the step S8: etching the dielectric layer 32 until a portion of the upper surface of the silicon substrate 31 using the rest second photoresist as a hard mask, and then removing the rest second photoresist 37 to form a second VIA hole 310; after removing the separation film, keep on etching a part of the rest dielectric layer 32 using the rest first photoresist as a hard mask, and then forming the second metal trench 39 after removing the rest first photoresist 33;

As is shown in FIG. 3i, in the step S9: filling metal material into the second VIA hole 310 and the second metal trench 39, to form VIA-hole interconnection structure 312 disposed in the second VIA hole and metal interconnection line 311 disposed in the second metal trench;

In this step, filling metal material into the second VIA hole 310 and the second metal trench 39 using metal deposition and CMP technology, to form VIA-hole interconnection structure 312 disposed in the second VIA hole and metal interconnection line 311 disposed in the second metal trench.

Although the above is a description in detail for embodiments of the present invention, the invention is not limited to those described embodiments, and the above embodiments are just examples. For the skilled in the art, any equivalent modifications and replacements are in the scope of the invention. Hence, equivalent modifications and replacements within the spirit and the range of the invention can be protected in the range of the invention.

What is claimed is:

1. A method for manufacturing trench-first copper interconnections, the method comprising the steps of:
   depositing a first dielectric layer on a silicon substrate;
   coating a first photoresist on said first dielectric layer;
   exposing and developing said first photoresist through a first lithographic process;
   removing a part of said first photoresist so that a remaining of said first photoresist forms a trench structure;
   coating upper surfaces of said remaining first photoresist and side-walls and bottom surfaces of said trench structure with a curing material;
   heating said curing material to form a separation film over said first photoresist;
   Removing excess curing material;

coating a second photoresist over said trench structure formed by said remaining first photoresist, so that said second photoresist covers an upper surface of said separation film;

exposing and developing said second photoresist through a second lithographic process;

removing a part of said second photoresist until a portion of an upper surface of said first dielectric layer is exposed, wherein a first VIA hole structure is formed in said second photoresist above said trench structure;

keeping a remaining of said second photoresist as a mask;

etching said first dielectric layer to expose a portion of an upper surface of said silicon substrate;

removing said remaining second photoresist to form a second VIA hole structure;

removing said separation film and etching a rest of said first dielectric layer by using a rest of said first photoresist as a mask;

removing said rest of said first photoresist to form a second metal trench; and filling metal material to said second VIA hole structure and said second metal trench to form metal interconnection lines disposed in said second VIA hole structure and said second metal trench.

2. A method for manufacturing trench-first copper interconnections of claim 1, wherein said first dielectric layer comprises a low-k dielectric layer.

3. A method for manufacturing trench-first copper interconnections of claim 1, wherein said first photoresist comprises an ability to form a hard mask.

4. A method for manufacturing trench-first copper interconnections of claim 1, wherein curing material is a polymer material comprising alkoxy group.

5. A method for manufacturing trench-first copper interconnections of claim 1, wherein temperature of said heating process falls between 30 degrees Celsius to 200 degrees Celsius.

6. A method for manufacturing trench-first copper interconnections of claim 1, wherein said separation film does not dissolve in said second photoresist.

7. A method for manufacturing trench-first copper interconnections of claim 1, wherein said excess curing material is removed by a developer.

8. A method for manufacturing trench-first copper interconnections of claim 1, wherein a ratio of etching resistance between said first photoresist and said second photoresist is greater than or equal to 1.5:1.

9. A method for manufacturing trench-first copper interconnections of claim 1, wherein CMP technology is used to deposit metal material into said second VIA hole structure and said second metal trench structure, and to form metal interconnection lines disposed in said second VIA hole structure and said second metal trench structure.

* * * * *